(12) United States Patent
Sudo et al.

(10) Patent No.: US 9,810,526 B2
(45) Date of Patent: *Nov. 7, 2017

(54) METHOD FOR MEASURING THREE-DIMENSIONAL SHAPE OF SILICA GLASS CRUCIBLE, AND METHOD FOR PRODUCING MONOCRYSTALLINE SILICON

(71) Applicant: SUMCO CORPORATION, Minato-ku, Tokyo (JP)

(72) Inventors: Toshiaki Sudo, Akita (JP); Tadahiro Sato, Akita (JP); Ken Kitahara, Akita (JP)

(73) Assignee: SUMCO CORPORATION, Tokyo (JP)

( * ) Notice: Subject to any disclaimer, the term of this patent is extended or adjusted under 35 U.S.C. 154(b) by 342 days.

This patent is subject to a terminal disclaimer.

(21) Appl. No.: 14/365,544

(22) PCT Filed: Oct. 31, 2012

(86) PCT No.: PCT/JP2012/078261
§ 371 (c)(1),
(2) Date: Jun. 13, 2014

(87) PCT Pub. No.: WO2013/099434
PCT Pub. Date: Jul. 4, 2013

(65) Prior Publication Data
US 2015/0007764 A1 Jan. 8, 2015

(30) Foreign Application Priority Data

Dec. 27, 2011 (JP) ................................. 2011-285295
Dec. 27, 2011 (JP) ................................. 2011-285331

(51) Int. Cl.
C30B 15/26 (2006.01)
G01B 11/24 (2006.01)
(Continued)

(52) U.S. Cl.
CPC ............ *G01B 11/24* (2013.01); *C03B 19/095* (2013.01); *C30B 15/10* (2013.01); *C30B 15/20* (2013.01);
(Continued)

(58) Field of Classification Search
CPC ......... C30B 15/10; C30B 15/26; C30B 15/20; G01B 11/24
See application file for complete search history.

(56) References Cited

U.S. PATENT DOCUMENTS

| | | | |
|---|---|---|---|
| 4,752,964 A | 6/1988 | Okada et al. | |
| 2005/0102061 A1* | 5/2005 | Lent ........................ | C22B 11/00 700/245 |

(Continued)

FOREIGN PATENT DOCUMENTS

| | | | |
|---|---|---|---|
| JP | S61-131859 A | 6/1986 | |
| JP | H06-226658 A | 8/1994 | |

(Continued)

OTHER PUBLICATIONS

Japan Platform for Patent Information, English Computer translation of JP 2005-249487 A (2016).*

(Continued)

*Primary Examiner* — Matthew Song
(74) *Attorney, Agent, or Firm* — Law Office of Katsuhiro Arai (57) ABSTRACT

A method for measuring a three-dimensional shape of an inner surface of a vitreous silica crucible which enables the measurement of the three-dimensional shape of the inner surface of the crucible without contaminating the inner surface of the crucible, is provided. According to the present invention, a method for measuring a three-dimensional shape of a vitreous silica crucible, including a fogging step to form a fog onto an inner surface of the vitreous silica (Continued)

crucible, a three-dimensional shape measuring step to measure a three-dimensional shape of the inner surface, by measuring a reflected light from the inner surface irradiated with light, is provided.

9 Claims, 6 Drawing Sheets (51) Int. Cl.
*C30B 15/10* (2006.01)
*C30B 29/06* (2006.01)
*C03B 19/09* (2006.01)
*C30B 15/20* (2006.01)
*H01L 21/66* (2006.01)

(52) U.S. Cl.
CPC .............. *C30B 15/26* (2013.01); *C30B 29/06* (2013.01); *H01L 22/12* (2013.01)

(56) References Cited

U.S. PATENT DOCUMENTS

2007/0195311 A1* 8/2007 Morgan ............... A61F 2/16
356/124
2008/0250659 A1* 10/2008 Bellerose ............. G05B 19/402
33/1 MP
2010/0162943 A1 7/2010 Kishi
2014/0326172 A1* 11/2014 Sudo ....................... C30B 29/06
117/15

FOREIGN PATENT DOCUMENTS

| JP | 08208376 A | * | 8/1996 |
|----|----|----|----|
| JP | H08-208376 A | | 8/1996 |
| JP | H11-211437 A | | 8/1999 |
| JP | 2000-221009 A | | 8/2000 |
| JP | 2003-172614 A | | 6/2003 |
| JP | 2005-249487 A | | 9/2005 |
| JP | 2005249487 A | * | 9/2005 |
| JP | 2006-096618 A | | 4/2006 |
| JP | 2008-281399 A | | 11/2008 |
| JP | 2008-298477 A | | 12/2008 |
| JP | 2009-002823 A | | 1/2009 |
| JP | 2010-030884 A | | 2/2010 |

OTHER PUBLICATIONS

Japan Platform for Patent Information, English Computer translation of JP 08-208376 A (2016).*
International Search Report (ISR) for PCT/JP2012/078261, dated Nov. 27, 2012.

* cited by examiner

METHOD FOR MEASURING THREE-DIMENSIONAL SHAPE OF SILICA GLASS CRUCIBLE, AND METHOD FOR PRODUCING MONOCRYSTALLINE SILICON

This application is the U.S. National Phase under 35 U.S.C. §371 of International Application PCT/JP2012/078261, filed Oct. 31, 2012, which claims priority to Japanese Patent Applications No. 2011-285295, filed Dec. 27, 2011 and No. 2011-285331, filed Dec. 27, 2011. The International Application was published under PCT Article 21(2) in a language other than English.

TECHNICAL FIELD

The present invention relates to a method for measuring a three-dimensional shape of a vitreous silica crucible, and to a manufacturing method of a monocrystalline silicon.

BACKGROUND ART

A monocrystalline silicon has been manufactured by the Czochralski method (the CZ method) using a vitreous silica crucible. In particular, a silicon melt obtained by melting polycrystalline silicon raw material is retained in the vitreous silica crucible, and then the silicon melt is allowed to come in contact with a seed crystal of a monocrystalline silicon, followed by gradual pulling of the seed crystal while rotating the seed crystal. Thus, the monocrystalline silicon is manufactured by allowing the single crystal to grow with the seed crystal acting as a core. The softening point of the vitreous silica is approximately 1200 to 1300° C., while the pulling temperature of the monocrystalline silicon is 1450 to 1500° C., which is an extremely high temperature above the softening point of the monocrystalline silicon. In addition, the time required for the pulling may exceed two weeks.

The monocrystalline silicon being pulled is required to have a purity of 99.999999999% or higher, and thus the vitreous silica crucible used for the pulling is also required to have high purity.

The diameter size of the vitreous silica crucible varies as 28 inches (approximately 71 cm), 32 inches (approximately 81 cm), 36 inches (approximately 91 cm), 40 inches (approximately 101 cm), and the like. The crucible with the diameter of 101 cm is huge, with its weight being approximately 120 kg. The weight of the silicon melt being retained therein is 900 kg or more. Accordingly, when pulling the monocrystalline silicon, 900 kg or more of the silicone melt at approximately 1500° C. is retained in the crucible.

One example of the manufacturing method of such vitreous silica crucible includes a silica powder layer forming step to form a silica powder layer by depositing the silica powder having an average particle diameter of approximately 300 μm onto the inner surface of a rotating mold; an arc fusing step to form a vitreous silica layer by arc fusing the silica powder layer while depressurizing the silica powder layer from the mold side (hereinafter referred to as a "rotating mold method").

During the early stage of the arc fusing step, the silica powder layer is strongly depressurized, thereby removing bubbles to form a transparent vitreous silica layer (hereinafter referred to as "transparent layer"). Then, the degree of depressurizing is weakened to form a bubble containing vitreous silica layer (hereinafter referred to as "bubble containing layer"), with remaining bubbles. Accordingly, a vitreous silica crucible having a two-layer structure, with the transparent layer at the inner surface side and the bubble containing layer at the outer surface side, can be formed.

As the silica powder used for the manufacture of the crucible, natural silica powder manufactured by pulverizing natural quartz, and synthetic silica powder manufactured by chemical synthesis can be mentioned. Here, physical property, shape, and size of natural silica powder tend to vary since the raw material of the natural silica powder is a natural product. When the physical property, shape, or size varies, the fused state of the silica powder varies, and thus the three-dimensional shape of the crucible being manufactured would vary even when the arc fusing is conducted under the same conditions.

In order to conduct the arc fusing with an intent to suppress such variation, or to conduct the pulling of the monocrystalline silicon by taking such variation in consideration, it is necessary to understand the three-dimensional shape of all crucibles.

As a method for measuring the three-dimensional shape, a light section method in which an object to be measured is irradiated with a slit light, and a pattern projection method in which the object to be measured is irradiated with a pattern light, are disclosed as conventional techniques in Patent Document 1.

Here, when measuring the three-dimensional shape by the light irradiation method, the data of the three-dimensional shape for the object to be measured is obtained by receiving the reflected light reflected by the object to be measured, and then analyzing the data of the reflected light. Therefore, it is important to receive the appropriate reflected light. However, when the object to be measured is a transparent body such as a vitreous silica crucible for example, the three-dimensional shape may not be measured properly due to the internal scattering light.

Therefore, when measuring a transparent body, a reflecting material such as white powder and the like was applied onto its surface to suppress the generation of internal scattering light.

PRIOR ART REFERENCE

Patent Document

Patent Document 1: JP-A-2008-281399

SUMMARY OF THE INVENTION

Problems to be Solved by the Inventions

When the three-dimensional shape of the inner surface of the vitreous silica crucible was measured by the conventional method, the reflecting material need be applied onto the inner surface of the crucible. However, when the reflecting material was applied onto the inner surface of the crucible, the reflecting material may contaminate the inner surface, or the reflecting material may remain on the surface. In such cases, it may cause an adverse effect on the manufacturing yield of the monocrystalline silicon. Therefore, the method of applying the reflecting material cannot be used for measuring the three-dimensional shape of the inner surface of the crucible.

The present invention has been made in view of such circumstances, and provides a method for measuring a three-dimensional shape of a vitreous silica crucible, which enables to measure the three-dimensional shape of the inner surface of the crucible without contaminating the inner surface of the crucible.

Means for Solving the Problems

According to the present invention, a method for measuring a three-dimensional shape of a vitreous silica crucible, comprising the steps of:

forming a fog onto an inner surface of the vitreous silica crucible, measuring a three-dimensional shape of the inner surface, by measuring a reflected light from the inner surface irradiated with light, is provided.

The present inventors have investigated the method which enables the measurement of the three-dimensional shape of the inner surface of the crucible without contaminating the inner surface of the crucible. The inventors got an idea to achieve the measurement of the three-dimensional shape of the inner surface from the fact that when the crucible was white with fog, the light was irregularly reflected at the inner surface of the crucible, thereby allowing appropriate detection of the diffused reflected light. Actually, experimentation carried out by using a commercially available three-dimensional shape measuring machine revealed that when there was no fog on the surface, the reflected light from the inner surface of the crucible was not appropriately detected, thereby making it impossible to measure the three-dimensional shape, however, when the crucible was thoroughly cooled in a refrigerator and then placed in a room at ambient temperature, allowing fog to generate on the surface, the measurement carried out with the crucible with fog succeeded in the detection of the reflected light from the inner surface of the crucible. Accordingly, measurement of the three-dimensional shape of the inner surface of the crucible was achieved.

Since the component of the fog on the crucible is water vapor in the air, the fog and the moisture can be removed from the surface of the crucible by merely heating or drying the crucible. Therefore, the inner surface of the crucible is not contaminated.

Further, the superior point of the present invention is that the three-dimensional shape of the actual product can be obtained, since the three-dimensional shape of the entire inner surface of the crucible can be determined in a non-destructive manner. In the conventional method, the crucible was cut to prepare a sample, and the three-dimensional shape of this sample was measured. Accordingly, the conventional method was problematic in that the data cannot be obtained for the actual product, and the preparation of the sample required time and cost. Therefore, the present invention is advantageous since the three-dimensional shape of the actual product can be measured at low cost. In addition, the present invention is especially advantageous for huge crucibles with an outer diameter of 28 inches or more, and extra-huge crucibles with an outer diameter of 40 inches or more. This is since the time and cost required for preparing samples for these crucibles would be extremely long and high respectively, when compared with those for the small crucibles.

Further, the present invention is advantageous in that the three-dimensional shape of the inner surface of the crucible can be measured in a contactless manner. As described, manufacture of a monocrystalline silicon with extremely high purity of 99.999999999% or higher requires the inner surface of the crucible to be kept at high cleanliness. While the inner surface of the crucible gets easily contaminated in the contact process, the contactless process of the present invention can prevent the inner surface from getting contaminated.

Therefore, according to the present invention, the three-dimensional shape of the inner surface of the crucible can be measured without contaminating the inner surface of the crucible.

The present invention enables the measurement of the three-dimensional shape of a transparent body by a very simple method which makes the transparent body substantially a non-transparent body. Therefore, the present invention can be applied to methods for measuring three-dimensional shapes, which utilize various light irradiation methods.

<Precise Measurement of the Three-Dimensional Shape of the Inner Surface of the Crucible>

The shape of the inner surface of the crucible directly affects the manufacturing yield of the monocrystalline silicon, and thus it is necessary to measure the shape precisely. However, there are cases where the precision of the three-dimensional shape measured by the afore-mentioned method is not sufficient as the shape of the inner surface of the crucible.

Accordingly, the present invention preferably comprises the steps of:

moving an internal ranging section along an inner surface of the vitreous silica crucible in a contactless manner in accordance with the three-dimensional shape;

measuring a distance between the internal ranging section and the inner surface as a distance from the inner surface, by subjecting the inner surface of the crucible to irradiation with laser light and then detecting a reflected light from the inner surface, the laser light being emitted from the internal ranging section in an oblique direction with respect to the inner surface, and the measurement being conducted at a plurality of measuring points along a course of a movement of the internal ranging section; and obtaining a three-dimensional shape of the inner surface of the crucible, by associating three-dimensional coordinates of each of the measuring points with the distance from the inner surface.

The inventors of the present invention have found that when the laser light was emitted in an oblique direction with respect to the inner surface of the crucible, the reflected light from the inner surface of the crucible (light reflected by inner surface) can be detected.

Then, the light reflected by inner surface is detected by a different position of a detecting unit of the internal ranging section in accordance with the distance between the internal ranging section and the inner surface. This allows the measurement of the distance from inner surface, which is the distance between the internal ranging section and the inner surface, in accordance with the triangulation principle.

In addition, by carrying out the measurement at a plurality of measuring points along the inner surface of the crucible, the coordinates of the internal ranging section can be associated with the distance from inner surface to obtain the coordinates of the inner surface of the crucible that correspond to each of the measuring points.

Accordingly, by carrying out the measurement for each of the plurality of measuring points arranged as a mesh with 2 mm distance for example, coordinates of the inner surface can be obtained as a mesh. Thus, the three-dimensional shape of the inner surface of the crucible can be obtained.

This method is advantageous since the sampling rate of the data is very high. When a preliminary experiment was carried out for a crucible having a diameter of 1 m and 100,000 measuring points, the three-dimensional shape of the entire inner surface was measured in about 10 minutes.

The internal ranging section emits laser light towards the inner surface, and detects its reflected light in order to measure the distance, however, accurate measurement requires a certain level of accurate knowledge of the distance between the internal ranging section and the inner surface, and the incident angle of the laser light towards the inner surface. Therefore, regarding the bent portions such as the corner portions of the crucible, it was difficult to set the distance and the direction of the internal ranging section with respect to the inner surface. In contrast, in the present invention, the three-dimensional shape of the inner surface is obtained in advance, and the internal ranging section is moved in accordance with the three-dimensional shape. Therefore, the distance and the direction of the internal ranging section with respect to the inner surface can be set appropriately.

Here, concerning the manufacture of a huge monocrystalline silicon ingot having a diameter of 200 to 450 mm (for example, 200 mm, 300 mm, 450 mm) and a length of 2 m or more, a vitreous silica crucible is preferably used. The monocrystalline silicon wafer manufactured from such huge ingot is used preferably for the manufacture of flash memory or DRAM.

The price of the flash memories and DRAM are dropping rapidly, and thus it is necessary to manufacture the huge monocrystalline silicon ingot with high quality at low cost. For this purpose, the huge crucible need be manufactured with high quality at low cost.

In addition, processes using wafers having a diameter of 300 mm are the mainstream, and processes using wafers having a diameter of 450 mm are now under development. Therefore, in order to stably manufacture wafers having a diameter of 450 mm, demand for huge crucibles with high quality is increasing.

In the present invention, the three-dimensional shape of the inner surface of the crucible is measured for its entire circumference. Therefore, according to the present invention, determination of whether the shape of the inner surface of the crucible manufactured is identical with its specifications can be made easily. Then, when the shape of the inner surface does not meet the specifications, the manufacturing conditions such as the arc fusing conditions can be altered. Accordingly, crucibles with high quality, of which shape of the inner surface being identical with the specifications, can be manufactured with high manufacturing yield.

In addition, if the three-dimensional shape of the inner surface can be obtained accurately, various measuring devices such as a camera, a microscope, a probe for measuring infrared absorption spectrum, a probe for measuring Raman spectrum and the like can be moved along the inner surface of the crucible for measurement, thereby allowing to obtain a three-dimensional distribution of various physical properties of the inner surface of the crucible. Conventionally, samples were cut out from the crucible to measure the various physical properties, however, such procedure cannot achieve a non-destructive measurement nor inspection for all crucibles. Therefore, improvement in the quality of the crucible was not accomplished. In the present invention, various physical properties can be measured by a non-destructive measurement for all of the crucibles. Therefore, when an odd data is obtained, investigation can be conducted right away, and its cause can be investigated easily. As described, the present invention has a technical significance in that non-destructive measurement can be conducted for all of the crucibles, which was impossible with the conventional techniques.

It is preferable to carry out the measurement of the three-dimensional shape and the measurement of the three-dimensional distribution of the various physical properties of the inner surface, by moving a tip of a robot arm along the inner surface of the crucible and thus carrying out the measurement at a plurality of points during its movement. The advantage of this method is that the coordinates of the measuring points can be obtained. If an operator moves the probe and carries out the measurement, accurate coordinates of the points of measurement cannot be obtained, and thus it is impossible to accurately understand to which of the measuring points does each of the measured value corresponds. If the robot arm is used, accurate coordinate can be obtained, and thus the obtained data can be more utilized.

The larger the crucible becomes, the more difficult its manufacture becomes. This phenomena can be easily understood when the difficulty of baking a pancake having a diameter of 50 cm and a thickness of 5 cm is compared with the easiness of baking a pancake having a diameter of 10 cm and a thickness of 1 cm. The difficulty of the former is extremely high. Pancakes of large size easily get burnt on its surface, or become under-cooked in the inside. In a similar manner, heat management during the manufacture of the huge crucible is more difficult than that for the small crucible. This leads to variation in the shape of the inner surface and the physical properties of the inner surface. Therefore, the necessity of measuring the three-dimensional shape of the inner surface and the three-dimensional distribution of the physical properties by using the method of the present invention is especially high for huge crucible.

In addition, when the monocrystalline silicon is pulled, the silicon melt is heated with a carbon heater and the like provided around the crucible in order to maintain the temperature of the silicon melt retained in the crucible at a high temperature of 1450 to 1500° C. When the crucible becomes huge, the distance between the carbon heater and the center of the crucible becomes long (when the radius of the crucible enlarges from 25 cm to 50 cm, the distance between the carbon heater and the center of the crucible is approximately doubled). Accordingly, in order to maintain the temperature of the silicon melt at the center of the crucible at a temperature higher than the melting point of silicon, the quantity of heat applied to the silicon melt from the carbon heater via the crucible becomes large. Therefore, when the crucible becomes huge, the quantity of heat applied to the crucible also becomes large, and thus problems such as the deformation of the crucible arise. Thus, the variation in the shape of the crucible and the physical properties of the inner surface arise problems when the monocrystalline silicon is pulled. This problem is seen more with huge crucibles than with small crucibles. Therefore, the necessity of measuring the three-dimensional shape of the inner surface and the three-dimensional distribution of the physical properties by using the method of the present invention is especially high with huge crucibles.

Here, since the weight of huge crucibles are 38 kg or more (for example, crucibles having a diameter of 71 cm weigh 39 kg, crucibles having a diameter of 81 cm weigh 59 kg, crucibles having a diameter of 91 cm weigh 77 kg, crucibles having a diameter of 101 cm weigh 121 kg), it is very difficult to handle them by man hand. In addition, in order to measure the three-dimensional shape of the inner surface around the crucible, it is necessary to rotate the crucible. However, it is difficult to rotate the crucible with man hand, and to obtain the rotation angle accurately when rotated with man hand. Accordingly, the present inventors have thought of holding the crucible with a robot arm for conveyance, and to carry out the measuring while holding. By using the robot arm for conveyance, heavy and fragile crucible can be conveyed easily and safely, and the crucible can be set at an accurate position of a measurement area. In addition, the crucible can be accurately rotated by 5 degrees for example, and thus the three-dimensional shape of the inner surface and the three-dimensional distribution of the physical properties can be measured accurately.

The area of the inner surface of the crucible is 14,400 cm$^2$ for the crucible having a diameter of 81 cm, 16,640 cm$^2$ for the crucible having a diameter of 91 cm, and 21,109 cm$^2$ for the crucible having a diameter of 101 cm. An image of the inner surface can be taken by moving the tip of an internal robot arm along the inner surface of the crucible. Here, if the size of an image is 4 cm×4 cm, the number of the images when the image of the entire inner surface is taken would be approximately 900 images for the crucible having a diameter of 81 cm, 1,000 images for the crucible having a diameter of 91 cm, and 1,300 images for the crucible having a diameter of 101 cm. Such number of images would be required for each of the crucibles. However, when the method of the present invention is used, images are taken by cooperating the internal robot arm and the robot arm for conveyance, and thus such a large number of images can be taken in comparatively short time.

<Precise Measurement of the Three-Dimensional Shape of the Interface of the Crucible>

Preferably, the crucible comprises a transparent vitreous silica layer at an inner surface side, and a bubble containing layer at an outer surface side, and the internal ranging section detects light reflected by interface, the interface being an interface between the transparent vitreous silica layer and the bubble containing layer, and measures a distance between the internal ranging section and an interface as a distance from interface;

and the method for measuring the three-dimensional shape of the vitreous silica crucible further comprises a step of:

obtaining a three-dimensional shape of the interface by associating three-dimensional coordinates of each of the measuring points with the distance from interface.

The present inventors have found that when the laser light was emitted in an oblique direction with respect to the inner surface of the crucible, the reflected light from the interface between the transparent layer and the bubble containing layer (light reflected by interface) was detected in addition to the reflected light from the inner surface of the crucible (light reflected by inner surface). Here, the interface between the transparent layer and the bubble containing layer is a plane where the bubble content rate changes dramatically, however, such interface is not as distinct as the interface between air and glass. Therefore, the finding that the light reflected from the interface between the transparent layer and the bubble containing layer can be detected was very surprising.

Then, the light reflected by inner surface and the light reflected by interface are detected by a different position of a detecting unit of the internal ranging section. This allows the measurement of the distance from inner surface, which is the distance between the internal ranging section and the inner surface, and the distance from interface, which is the distance between the internal ranging section and the interface, in accordance with the triangulation principle.

In addition, by carrying out the measurement at a plurality of measuring points along the inner surface of the crucible, the coordinates of the internal ranging section can be associated with the distance from inner surface and the distance from interface to obtain the coordinates of the inner surface of the crucible and the coordinates of the interface of the crucible that correspond to each of the measuring points.

Accordingly, by carrying out the measurement for each of the plurality of measuring points arranged as a mesh with 2 mm distance for example, coordinates of the inner surface and the coordinates of the interface can be obtained as a mesh. Thus, the three-dimensional shape of the inner surface and the interface of the crucible can be obtained. In addition, by calculating the distance between the inner surface and the interface, the thickness of the transparent layer can be calculated for arbitrary positions. Therefore, the three-dimensional distribution of the thickness of the transparent layer can be obtained.

DESCRIPTION OF THE PREFERRED EMBODIMENTS

Hereinafter, the method for measuring the three-dimensional shape of the vitreous silica crucible according to the present embodiment will be described with reference to the figures.

<1. Vitreous Silica Crucible>

Figure 1:
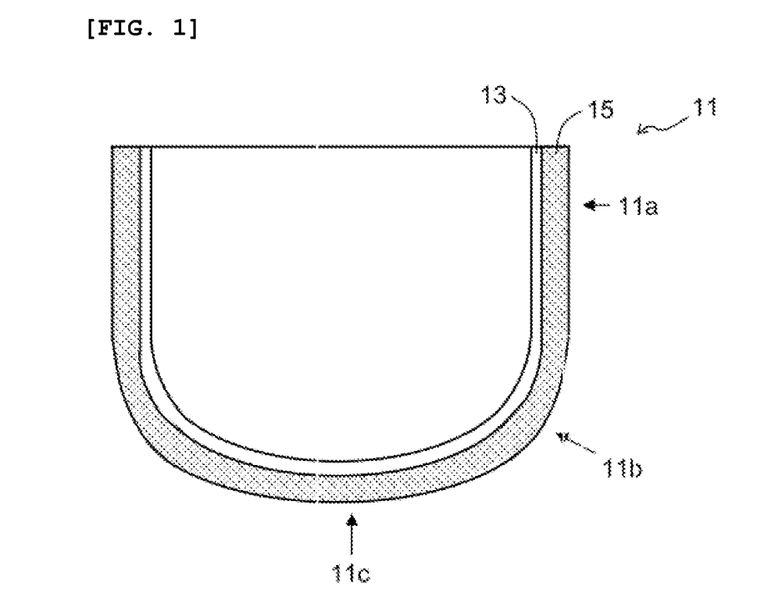
FIG. 1 is an explanatory drawing of a vitreous silica crucible according to an embodiment of the present invention.

Hereinafter, the vitreous silica crucible 11 used in the present embodiment will be described with reference to FIG. 1. The crucible 11 is, in one example, manufactured by a method comprising a silica powder layer forming step to form a silica powder layer by depositing the silica powder having an average particle diameter of approximately 300 μm onto the inner surface of a rotating mold; an arc fusing step to form a vitreous silica layer by arc fusing the silica powder layer while depressurizing the silica powder layer from the mold side (hereinafter referred to as a "rotating mold method").

During the early stage of the arc fusing step, the silica powder layer is strongly depressurized, thereby removing bubbles to form a transparent vitreous silica layer (hereinafter referred to as "transparent layer") 13. Then, the degree of depressurization is weakened to form a bubble containing vitreous silica layer (hereinafter referred to as "bubble containing layer") 15, with remaining bubbles. Accordingly, a vitreous silica crucible having a two-layer structure, with the transparent layer 13 at the inner surface side and the bubble containing layer 15 at the outer surface side can be formed.

As the silica powder used for the manufacture of the crucible, natural silica powder manufactured by pulverizing natural quartz, and synthetic silica powder manufactured by chemical synthesis can be mentioned. Here, physical property, shape, and size of natural silica powder tend to vary since the raw material of the natural silica powder is a natural product. When the physical property, shape, or size varies, the fused state of the silica powder varies, and thus the three-dimensional shape of the inner surface of the crucible being manufactured would vary among the crucibles, even when the arc fusing is conducted under the same conditions. Therefore, the three-dimensional shape of the inner surface need be measured for each one of the manufactured crucibles.

The vitreous silica crucible 11 comprises a cylindrical sidewall portion 11a, a curved bottom portion 11c, and a corner portion 11b connecting the sidewall portion 11a and the bottom portion 11c, the curvature of the corner portion 11b being larger than that of the bottom portion 11c. In the present invention, the corner portion 11b is a portion where the sidewall portion 11a and the bottom portion 11c are linked, and starts from the point where the tangential line of the curve of the corner portion falls on the sidewall portion 11a of the vitreous silica crucible, to the point where the tangential line of the corner portion and the tangential line of the bottom portion 11c becomes the common tangent. In other words, the point where the sidewall portion 11a of the vitreous silica crucible 11 starts to bend is the boundary between the sidewall portion 11a and the corner portion 11b. Further, the portion of the bottom of the crucible where the curvature is constant is the bottom portion 11c, and the point where the curvature starts to change as the distance from the center of the bottom of the crucible increases is the boundary between the bottom portion 11c and the corner portion 11b.

<2. Method for Measuring Three-Dimensional Shape>

The crucible 11 as manufactured by the afore-described method has a transparent body, and thus the reflected light was not detectable with the contactless method for measuring three-dimensional shape which uses the conventional light irradiation procedure. Accordingly, it was difficult to measure the three-dimensional shape. Therefore, in the present embodiment, a fog is formed on the inner surface of the crucible before carrying out the measurement of the three-dimensional shape, and the inner surface in a whitish condition is irradiated with a light for measuring the shape. When the inner surface is in a condition without fog being formed thereon, the light reflected by the surface from the inner surface of the crucible and the internally scattered light from the inside of the crucible would be superimposed, and thus accurate measurement of the three-dimensional shape is difficult. On the other hand, when the inner surface is in the condition with a fog being formed thereon, a large portion of the light for measurement would be scattered at the surface, and would hardly go inside the crucible. Therefore, effect of the internally scattered light can be eliminated, and thus accurate measurement of the three-dimensional shape is enabled.

In the present specification, "fog" refers to a phenomenon similar to that observed with window glasses getting whitish in winter. When an atmosphere around a cold object is cooled, water vapor contained in the atmosphere is condensed to form minute particles. Then a large number of these minute particles adhere onto the surface of the object, making the surface whitish.

Fog is formed when the temperature of the atmosphere at the surface of the object becomes lower than its dew point. Here, dew point becomes higher as the amount of water vapor contained in the surrounding atmosphere increases. Therefore, in order to promote the formation of fog, the object should be cooled, or the amount of water vapor contained in the surrounding atmosphere should be increased. The water used for increasing the amount of water vapor is preferably the ultra pure water used in the manufacture of semiconductors and the like. In such case, the cleanliness of the inner surface of the crucible can be maintained at an extremely high level.

Therefore, in order to form a fog onto the inner surface of the crucible 11, the crucible 11 sufficiently cooled in a refrigerated room may be brought into a measuring room at ambient temperature, or the crucible 11 placed in the measuring room may be allowed to come in contact with a coolant to cool the crucible 11. Otherwise, in another method, the temperature of the measuring room may be set comparatively low, and then the amount of water vapor contained in the atmosphere in the measuring room may be increased using a humidifier (ultrasonic type, thermal type, and the like) to form the fog on the crucible 11. The method for cooling the crucible 11 itself and the method for increasing the amount of water vapor contained in the measuring room may be used in combination. In addition, when the crucible 11 is mounted with its opening portion facing downward, the replacement of the atmosphere inside and the outside the crucible 11 becomes less. If the water vapor is supplied inside the crucible 11 is such condition, the amount of water vapor contained in the atmosphere contacting the inner surface of the crucible 11 can be increased easily.

The fog on the surface of the crucible 11 is faint at first. In such condition, the effect of the internally scattered light cannot be eliminated sufficiently, and thus appropriate measurement of the three-dimensional shape cannot be performed. As time passes, the whiteness increases gradually, and then reaches a condition in which the water minute particles are uniformly dispersed and adhered on the surface. This is the condition appropriate for measuring the three-dimensional shape. When time passes further, the amount of water adhered to the surface increases, allowing neighboring water minute particles to come into contact and aggregate. Then, the aggregated water drops would fall due to gravity and thus aggregation further progresses. Appropriate measurement of the three-dimensional shape cannot be performed in this condition, either. Therefore, the measurement of the three-dimensional shape need be conducted at an appropriate timing. Accordingly, it is preferable to first achieve the conditions for forming the fog onto the crucible 11, and then carry out the measurement of the three-dimensional shape for several times within a predetermined interval. By such procedure, measurement of the three-dimensional shape can be carried out with an appropriate fogging condition.

Figure 2:
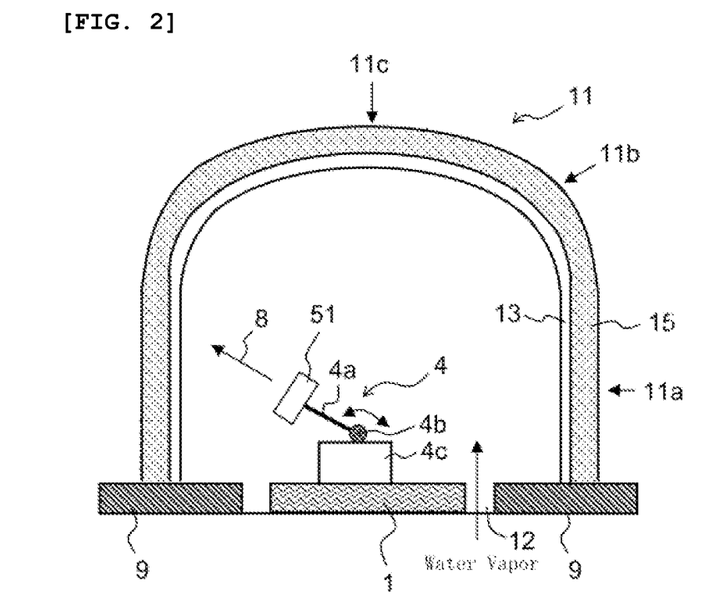
FIG. 2 is an explanatory drawing of a method for measuring a three-dimensional shape of a vitreous silica crucible.

Here, an example of the measurement of the three-dimensional shape of the inner surface of the crucible according to the present embodiment will be explained with reference to FIG. 2.

The vitreous silica crucible 11 as a measuring object is mounted on the rotatable rotating table 9 with its opening portion facing downwards. The crucible 11 may be placed on the rotating table 9 immediately after being taken out from a refrigerating room not shown, or the rotating table 9 may have a cooling function to cool the crucible 11. In either way, a crucible at a temperature lower than the surrounding temperature is placed on the rotating table 9. Water vapor is supplied into the internal space of the crucible 11 from the opening portion 12 provided between the base 1 and the rotating table 9. Accordingly, the water vapor contained in the atmosphere of the internal space of the crucible 11 is increased, and the inner surface of the crucible 11 can easily be fogged.

A robot arm 4 is arranged on the base 1, the base 1 being arranged at a position covered with the crucible 11. The robot arm 4 comprises an arm 4a, a joint 4b to rotatably support the arm 4a, and a main body section 4c. An external terminal (not shown) is provided to the main body section 4c, to enable the main body section 4c to exchange data with an external device. The tip of the robot arm 4 is provided with a three-dimensional shape measuring section 51 to measure the three-dimensional shape of the inner surface of the crucible 11. The inner surface of the crucible 11 is irradiated with a measuring light from the three-dimensional shape measuring section 51, while the inner surface of the crucible 11 is in a fogged condition. Then, the reflected light from the inner surface is detected, and thus the three-dimensional shape of the inner surface of the crucible 11 is measured. A controlling section to control the joint 4b and the three-dimensional shape measuring section 51 is provided inside the main body section 4c. The controlling section moves the arm 4a by rotating the joint 4b in accordance with a program installed in the main body section 4c or with an external input signal, thereby changing the direction of the measuring light 8 emitted from the three-dimensional shape measuring section 51. Specifically, for example, the measurement is started from a position near the opening portion of the crucible 11, and then the three-dimensional measuring section 51 is moved towards the bottom portion 11c of the crucible 11, to carry out the measurement for a plurality of measuring points along the moving course.

When the measurement from the opening portion to the bottom portion 11c of the crucible is finished, the rotating table 9 is rotated with a small angle, and a similar measurement is carried out. This measurement may be carried out from the bottom portion 11c towards the opening portion. The rotating angle of the rotating table 9 is determined by taking the accuracy and the measuring time into consideration. When the rotating angle is too large, the accuracy of measurement is insufficient, and when the rotating angle is too small, the measuring time becomes too long. The rotation of the rotating table 9 is controlled in accordance with a stored program or with an external input signal. The rotating angle of the rotating table 9 can be detected with a rotary encoder and the like.

Accordingly, the three-dimensional shape of the entire inner surface of the crucible can be measured. After the three-dimensional shape of the entire inner surface of the crucible is measured, the inner surface of the crucible 11 can be dried by supplying dry air into the internal space of the crucible 11.

The three-dimensional shape thus obtained can be utilized in various applications. For example, by comparing the measured three-dimensional shape with the three-dimensional shape of its original design, the variation from the original design can be grasped for each of the crucibles. When the variation exceeds the standard value, the shape of the crucible can be adjusted, or shipment of the crucible can be avoided. Accordingly, the quality of the crucibles being shipped can be improved. In addition, conditions for manufacture (conditions for arc fusing and the like) can be associated with the shape of each of the crucibles, and feedback can be conducted when the shape of the crucible meets the standards. Further, by measuring Raman spectrum, infrared absorption spectrum, surface roughness, bubble content and the like for a plurality of measuring points with respect to the three-dimensional shape of the inner surface of the crucible, the three-dimensional distribution of their measurement value can be obtained. This three-dimensional distribution can be used for the shipping inspection. In addition, the data of the three-dimensional shape and the three-dimensional distribution of the various measurement values with respect to the three-dimensional shape can be used as a parameter for pulling the monocrystalline silicon. Accordingly, the pulling of the monocrystalline silicon can be controlled with higher accuracy.

Here, the method for measuring the three-dimensional shape of the inner surface of the crucible was described in detail, however, the three-dimensional shape of the outer surface of the crucible can be measured in a similar manner.

The three-dimensional shape obtained by the afore-mentioned method can be used as a basic data of the three-dimensional shape for measuring precise three-dimensional shape of the inner surface and the interface of the crucible. Hereinafter, the method for measuring the precise three-dimensional shape of the inner surface and the interface will be described in detail.

<3. Method for Measuring Precise Three-Dimensional Shape>

Hereinafter, the method for measuring the precise three-dimensional shape of the inner surface of the crucible will be explained with reference to FIGS. 3 to 6. In the present embodiment, the internal ranging section 17 comprising a laser displacement gauge and the like is contactlessly moved along the inner surface of the crucible. For each of the plurality of measuring points along the moving course, the inner surface of the crucible is irradiated with a laser light, the laser light being emitted in an oblique direction with respect to the inner surface. Then, the reflected light is detected to measure the three-dimensional shape of the inner surface of the crucible. Hereinafter, the method will be described in detail. Here, when the shape of the inner surface is being measured, the three-dimensional shape of the interface between the transparent layer 13 and the bubble containing layer 15 can be measured simultaneously. In addition, the three-dimensional shape of the outer surface of the crucible can be measured by using the external ranging section 19. These aspects will be also explained.

<3-1. Arrangement of Vitreous Silica Crucible, Internal Robot Arm, Internal Ranging Section>

Figure 3:
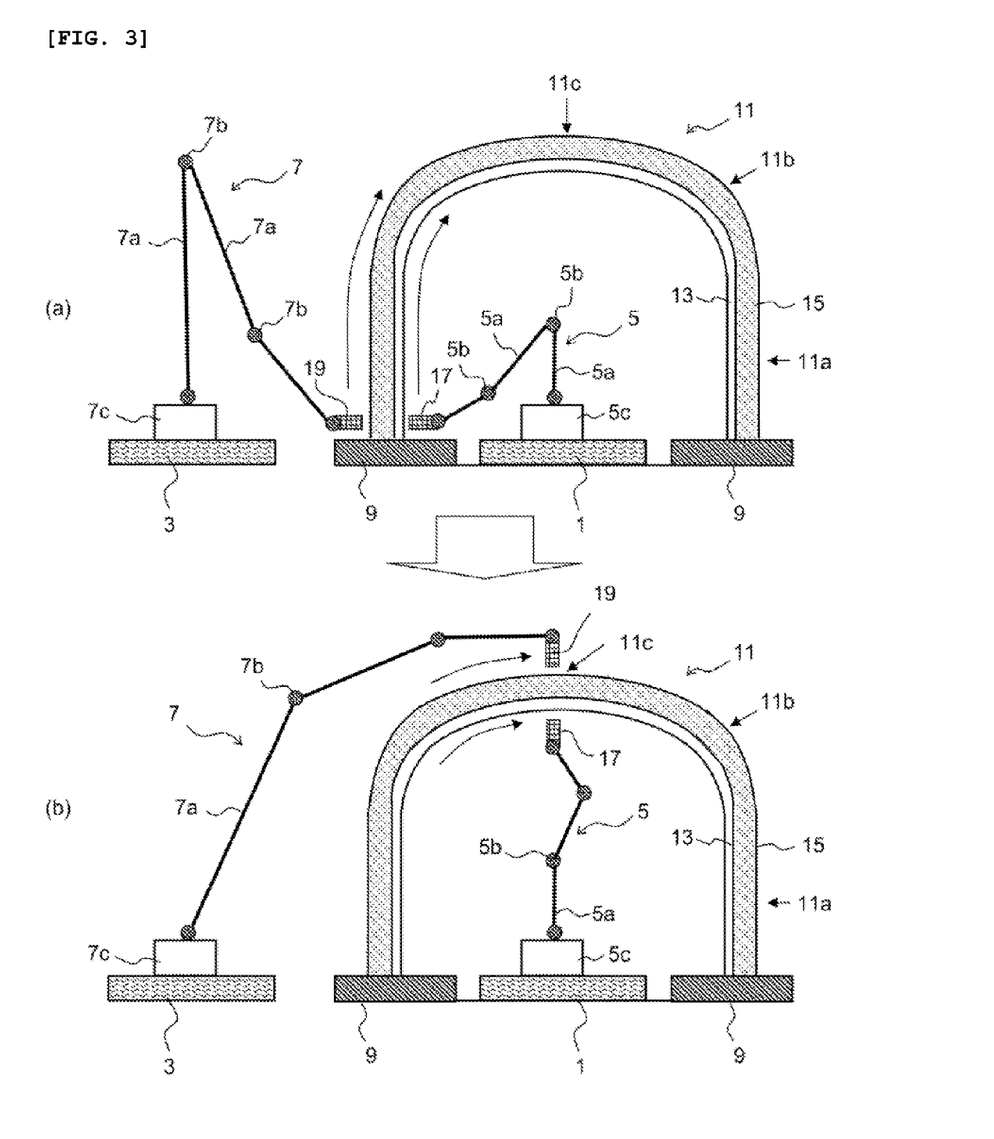
FIG. 3 is an explanatory drawing of a method for measuring a precise three-dimensional shape of a vitreous silica crucible.

The vitreous silica crucible 11 as a measuring object is mounted on the rotatable rotating table 9 with its opening portion facing downwards. The internal robot arm 5 is arranged on the base 1, the base 1 being arranged at a position covered with the crucible 11. The internal robot arm 5 is preferably a six-axis articulated robot, comprising a plurality of arms 5a, a plurality of joints 5b rotatably supporting the arm 5a, and a main body section 5c. An external terminal (not shown) is provided to the main body section 5c, to enable the main body section 5c to exchange data with an external device. The tip of the internal robot arm 5 is provided with a internal ranging section 17 to measure the shape of the inner surface of the crucible 11. The inner surface of the crucible 11 is irradiated with a laser light from the internal ranging section 17, and the reflected light from the inner surface is detected to measure the distance between the internal ranging section 17 and the inner surface of the crucible 11. A controlling section to control the joints 5b and the internal ranging section 17 is provided inside the main body section 5c. The controlling section moves the arm 5a by rotating the joints 5b in accordance with a program installed in the main body section 5c or with an external input signal, thereby moving the internal ranging section 17 to an arbitrary three-dimensional position. Specifically, the internal ranging section 17 is contactlessly moved along the inner surface of the crucible. Here, the controlling section is provided with data for the rough shape of the inner surface of the crucible, and the position of the internal ranging section 17 is moved in accordance with the data. The data for the rough shape is the data obtained for the three-dimensional shape in <2. Method for Measuring Three-dimensional Shape>. Conventionally, it was not easy to appropriately set the distance and the direction of the internal ranging section 17 with respect to the inner surface, regarding the bent portion such as the corner portion 11b of the crucible. On the other hand, in the present embodiment, the three-dimensional shape of the inner surface can be obtained in advance, and then the internal ranging section is moved in accordance with the obtained three-dimensional shape. Therefore, the distance and the direction of the internal ranging section with respect to the inner surface can be set appropriately.

More specifically, for example, the measurement is started from a position near the opening portion of the crucible 11, as shown in FIG. 3(a). Then the internal ranging section 17 is moved towards the bottom portion 11c of the crucible 11, to carry out the measurement for a plurality of measuring points along the moving course, as shown in FIG. 3(b). The interval of the measurement is 1-5 mm for example, and 2 mm for example. The measurement is conducted with the timing pre-stored in the internal ranging section 17, or in accordance with an external trigger. The results of the measurement are stored in the memory section of the internal ranging section 17, and are sent all together to the main body section 5c after the measurement is completed, or are sent to the main body section 5c each time after each of the measurement is conducted. The internal ranging section 17 may be structured so as to be controlled by a controlling section provided individually from the main body section 5c.

When the measurement from the opening portion to the bottom portion 11c of the crucible is finished, the rotating table 9 is rotated with a small angle, and a similar measurement is conducted. This measurement may be conducted from the bottom portion 11c towards the opening portion. The rotating angle of the rotating table 9 is determined by taking the accuracy and the measuring time into consideration and is 2-10 degrees (preferably 6.3 degrees or less). When the rotating angle is too large, the accuracy of measurement is insufficient, and when the rotating angle is too small, the measuring time becomes too long. The rotation of the rotating table 9 is controlled in accordance with a stored program or with an external input signal. The rotating angle of the rotating table 9 can be detected with a rotary encoder and the like. The rotation of the rotating table 9 is preferably linked with the movement of the internal ranging section 17 and the external ranging section 19 described later. By such, the calculation of the three-dimensional coordinates of the internal ranging section 17 and the external ranging section 19 becomes easy.

As described later, the internal ranging section 17 can measure both of the distance from the internal ranging section 17 to the inner surface (distance from inner surface), and the distance from the internal ranging section 17 to the interface between the transparent layer and the bubble containing layer 15 (distance from interface). Since the angle of the joint 5b is known from the rotary encoder and the like provided to the joint 5b, the three-dimensional coordinates and the direction of the internal ranging section 17 at each of the measuring points are also known. Accordingly, if the distance from inner surface and the distance from interface can be obtained, the three-dimensional coordinates at the inner surface and the three-dimensional coordinates at the interface are known. Then, since the measurement from the opening portion to the bottom portion 11c of the crucible 11 is conducted for the entire circumference of the crucible 11, the three-dimensional shape of the inner surface and the three-dimensional shape of the interface of the crucible 11 are known. In addition, since the distance between the inner surface and the interface is known, the thickness of the transparent layer 13 is known, and thus the three-dimensional distribution of the thickness of the transparent layer can be obtained.

<3-2. External Robot Arm, External Ranging Section>

On the base 3 provided outside the crucible 11, the external robot arm 7 is arranged. The external robot arm 7 is preferably a six-axis articulated robot, comprising a plurality of arms 7a, a plurality of joints 7b rotatably supporting the arm 7a, and a main body section 7c. An external terminal (not shown) is provided to the main body section 7c, to enable the main body section 7c to exchange data with an external device. The tip of the external robot arm 7 is provided with an external ranging section 19 to measure the shape of the outer surface of the crucible 11. The outer surface of the crucible 11 is irradiated with a laser light from the external ranging section 19, and the reflected light from the outer surface is detected to measure the distance between the external ranging section 19 and the outer surface of the crucible 11. A controlling section to control the joints 7b and the external ranging section 19 is provided inside the main body section 7c. The controlling section moves the arm 7a by rotating the joints 7b in accordance with a program installed in the main body section 7c or with an external input signal, thereby moving the external ranging section to an arbitrary three-dimensional position. Specifically, the external ranging section 19 is contactlessly moved along the outer surface of the crucible. Here, the controlling section is provided with data for the rough shape of the outer surface of the crucible, and the position of the external ranging section 19 is moved in accordance with the data. More specifically, for example, the measurement is started from a position near the opening portion of the crucible 11, as shown in FIG. 3(a). Then the external ranging section 19 is moved towards the bottom portion 11c of the crucible 11, to conduct the measurement for a plurality of measuring points along the moving course, as shown in FIG. 3(b). The interval of the measurement is 1-5 mm for example, and 2 mm for example. The measurement is conducted with the timing pre-stored in the external ranging section 19, or in accordance with an external trigger. The results of the measurement are stored in the memory section of the external ranging section 19, and are sent all together to the main body section 7c after the measurement is completed, or are sent to the main body section 7c each time after each of the measurement is conducted. The external ranging section 19 may be structured so as to be controlled by a controlling section provided individually from the main body section 7c.

The movement of the internal ranging section 17 and the external ranging section 19 may be synchronized. However, since the measurement of the shape of the inner surface and the shape of the outer surface are conducted independently, it is not necessary to synchronize their movement.

The external ranging section 19 can measure the distance from the external ranging section 19 to the outer surface (distance from outer surface). Since the angle of the joint 7b is known from the rotary encoder and the like provided to the joint 7b, the three-dimensional coordinates and the direction of the external ranging section 19 are also known. Accordingly, if the distance from outer surface can be obtained, the three-dimensional coordinates at the outer surface are known. Then, since the measurement from the opening portion to the bottom portion 11c of the crucible 11 is conducted for the entire circumference of the crucible 11, the three-dimensional shape of the outer surface of the crucible 11 is known.

Accordingly, since the three-dimensional shape of the inner surface and the outer surface of the crucible are known, the three-dimensional distribution of the wall thickness can be obtained for the crucible.

<3-3. Details of Measurement of Distance>

Here, the measurement of the distance by the internal ranging section 17 and the external ranging section 19 will be described in detail with reference to FIG. 4.

Figure 4:
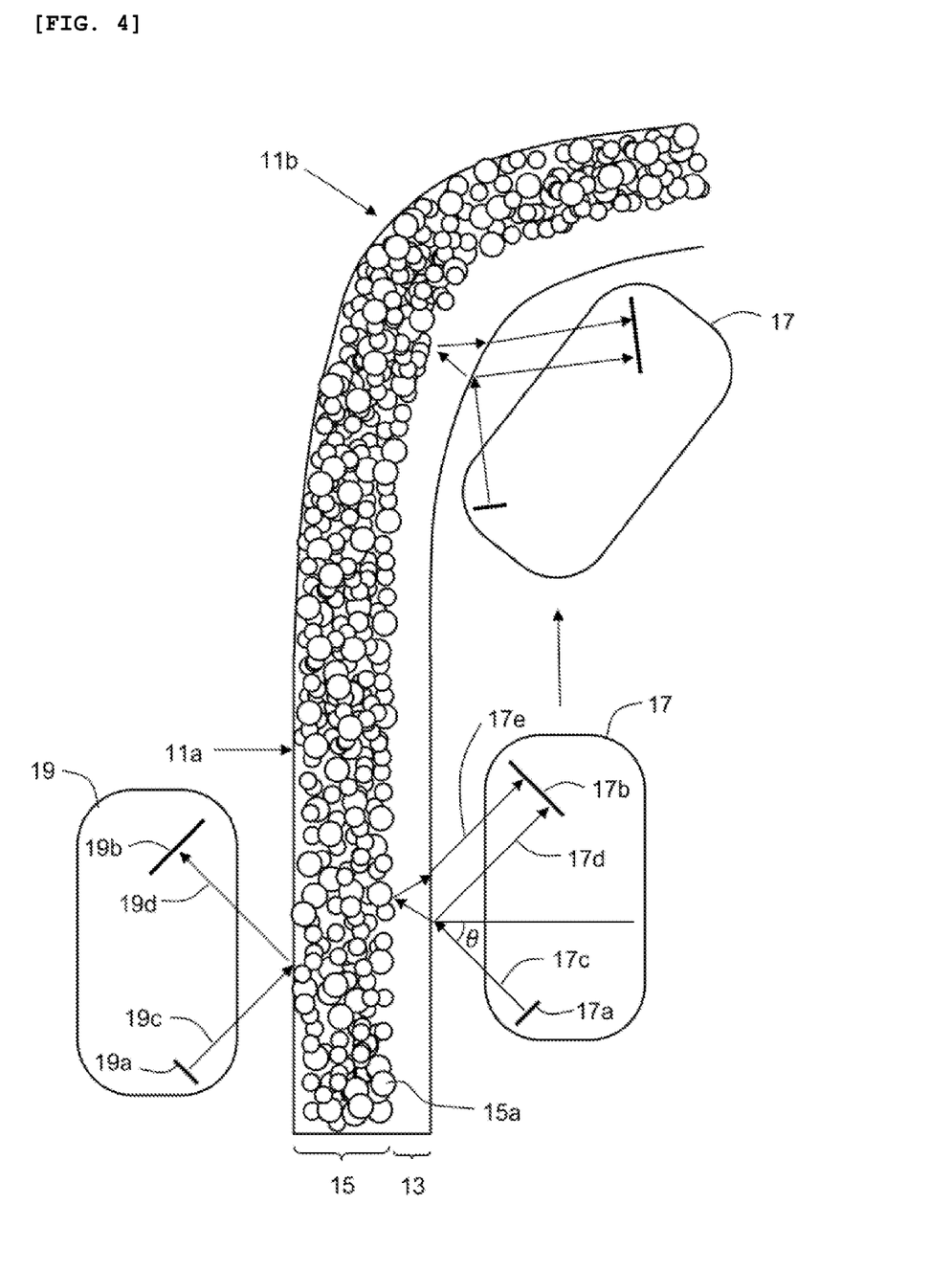
FIG. 4 is an enlarged view of the vitreous silica crucible of FIG. 3, amplifying the internal ranging section and its vicinity.

As shown in FIG. 4, the internal ranging section 17 is arranged at the inner surface side of the crucible 11 (at the transparent layer 13 side), and the external ranging section 19 is arranged at the outer surface side of the crucible 11 (at the bubble containing layer 15 side). The internal ranging section 17 comprises an emitting section 17a and a detecting section 17b. The external ranging section 19 comprises an emitting section 19a and a detecting section 19b. The measuring range of the internal ranging section 17 and the external ranging section 19 are, depending on the type of the measuring device, generally approximately ±5-10 mm. Therefore, the distance from the internal ranging section 17 to the inner surface and the distance from the external ranging section 19 to the outer surface need be set with some degree of accuracy. In addition, the internal ranging section 17 and the external ranging section 19 are each provided with a controlling section and an external terminal not shown. The emitting sections 17a and 19a are ones which emit a laser light, and are provided with a semiconductor laser source for example. The wavelength of the laser light being emitted is not particularly limited, however, it may be a red laser light having a wavelength of 600-700 nm. The detecting sections 17b and 19b are structured with CCD for example, and thus the distance to the target is determined based on the principle of triangulation, from the position where the light falls on.

The laser light emitted from the emitting sections 17a of the internal ranging section 17 is partially reflected at the inner surface (surface of the transparent layer 13), and is partially reflected at the interface between the transparent layer 13 and the bubble containing layer 15. These reflected lights (light reflected by inner surface and the light reflected by interface) strike the detecting section 17b, and are thus detected. As obvious from FIG. 4, the light reflected by inner surface and the light reflected by interface strike different positions of the detecting section 17b. From this difference in the position, the distance from the internal ranging section 17 to the inner surface (distance from inner surface) and the distance from the internal ranging section 17 to the interface (distance from interface) are determined respectively. Preferable angle of incidence θ may differ in accordance with the condition of the inner surface, thickness of the transparent layer 13, condition of the bubble containing layer 15 and the like. For example, it is 30-60 degrees.

Figure 5:
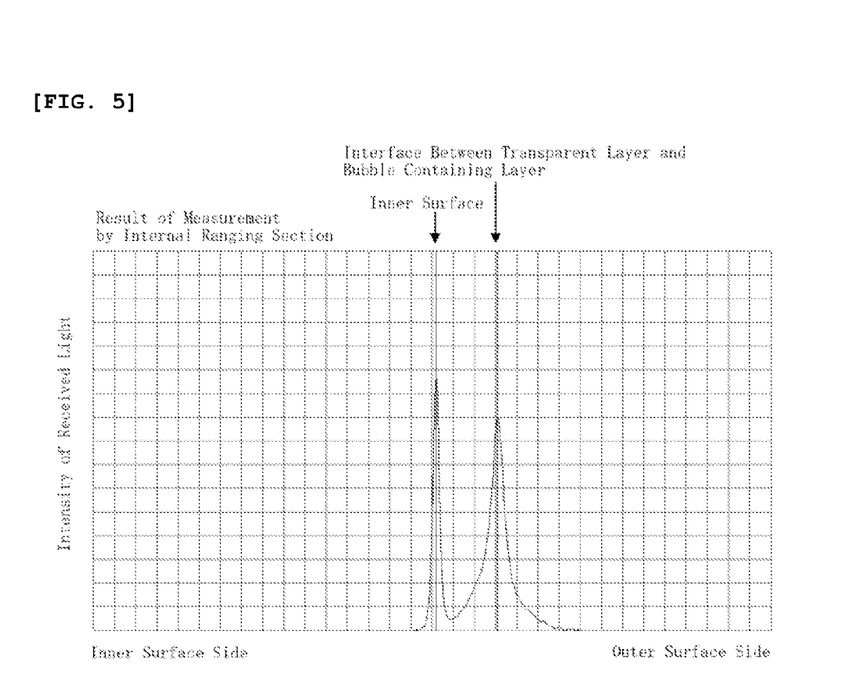
FIG. 5 shows a result of the measurement carried out with the internal ranging section of FIG. 3.

FIG. 5 shows an actual result of the measurement conducted with a commercially available laser displacement gauge. As shown in FIG. 5, two peaks are observed, wherein the peak at the inner surface side corresponds to the peak of the light reflected by inner surface, and the peak at the outer surface corresponds to the peak of the light reflected by interface. As seen in FIG. 5, the peak due to the reflected light from the interface between the transparent layer 13 and the bubble containing layer 15 is also detected clearly. Conventionally, interface had not been confirmed by such method, and thus this result is remarkably novel.

When the distance from the internal ranging section 17 to the inner surface is too large, or when the inner surface or the interface is locally oblique, there are cases where not both of the peaks are observed. In such case, it is preferable that the internal ranging section 17 is moved closer to the inner surface, or the internal ranging section 17 is tilted to alter the outgoing direction of the laser light, so as to search a position and an angle which allows the observation of two peaks. In addition, even when both of the peaks are not observed at the same time, the light reflected by inner surface may be observed at a certain position and an angle, and then the light reflected by interface may be observed at a different position and an angle. In addition, in order to prevent the internal ranging section 17 from coming into contact with the inner surface, it is preferable that the maximum proximity position is set, thereby preventing the internal ranging section 17 from coming close to the inner surface from such position even when the peak is not observed.

Here, at the corner portion 11b for example, the inner surface is bent, and thus it is not easy to appropriately set the position and the direction of the internal ranging section 17. However, in the present embodiment, the three-dimensional shape of the inner surface of the crucible is measured beforehand, and then the internal ranging section 17 is moved in accordance with the measured three-dimensional shape. Therefore, as shown in FIG. 4, it is easy to set the position and the direction of the internal ranging section 17 appropriately. The same can be said with the external ranging section 19.

Further, when there is an isolated bubble in the transparent layer 13, the internal ranging section 17 detects the reflected light from this bubble, and thus there are cases where the interface between the transparent layer 13 and the bubble containing layer 15 cannot be detected appropriately. Therefore, in a case where the position of the interface measured at a particular measuring point A shifts largely (exceeding a predetermined standard value) from the position of the interface measured at the measuring points before and after the measuring point A, the data obtained for the measuring point A may be eliminated. In such cases, the measurement may be conducted again at a position slightly shifted from the measuring point A, and the data obtained as such may be used.

Figure 6:
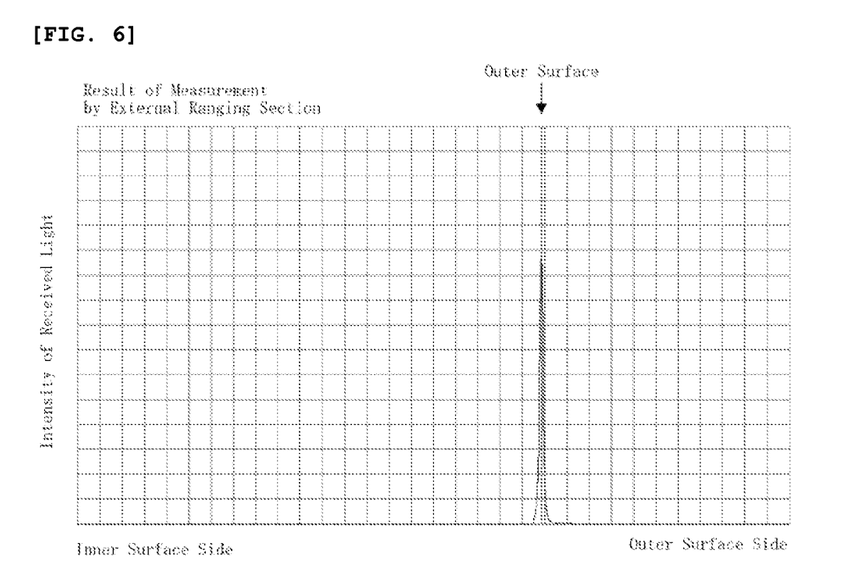
FIG. 6 shows a result of the measurement carried out with the external ranging section of FIG. 3.

In addition, the laser light emitted from the emitting section 19a of the external ranging section 19 is reflected at the surface of the outer surface (bubble containing layer 15), the reflected light (light reflected by outer surface) strikes the detecting section 19b, and thus the reflected light is detected. The distance between the external ranging section 19 and the outer surface is determined in accordance with the position of detection at the detecting section 19b. FIG. 6 shows the actual result of the measurement conducted with a commercially available laser displacement gauge. As shown in FIG. 6, only one peak is observed. In a case where the peak is not observed, it is preferable that the external ranging section 19 is moved closer to the inner surface, or the external ranging section 19 is tilted to alter the outgoing direction of the laser light, so as to search a position and an angle which allows the observation of the peak.

The coordination data of the three-dimensional shape of the inner surface, the interface, and the outer surface may be outputted. The data format is not particularly limited, and may be data of text format such as CSV, or may be data of one of the various CAD formats.

<3-4. Evaluation of the Crucible Shape Taking Dimension Tolerance into Consideration>

Figure 7:
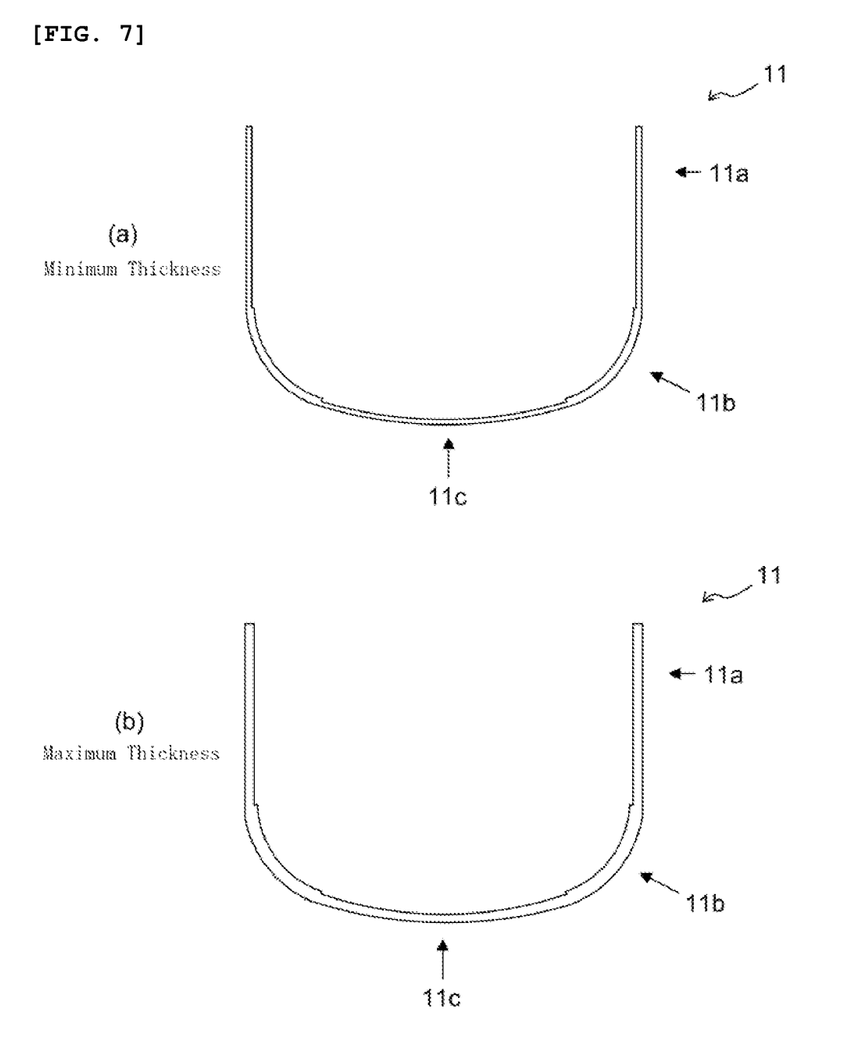
FIGS. 7(a) and 7(b) are each showing a shape of a crucible having minimum thickness and maximum thickness satisfying the dimension tolerance, respectively.

FIGS. 7(a) and 7(b) each show a shape of a crucible having minimum thickness and a shape of a crucible having a maximum thickness that satisfy the dimension tolerance for the original design, respectively. Since the dimension tolerance for the sidewall portion 11a, the corner portion 11b, and the bottom portion 11c are different from each other, their boundary is discontinuous. When the shape of the crucible 11 determined from the three-dimensional shape of the inner surface of the crucible 11 and the three-dimensional shape of the outer surface determined from the above-described method are within the shape of the crucible having minimum thickness satisfying the dimension tolerance shown in FIG. 7(a) and the shape of the crucible having maximum thickness satisfying the dimension tolerance shown in FIG. 7(b), the shape of the crucible 11 satisfies the dimension tolerance. In such case, the shape inspection test is passed. On the other hand, when at least a part of the shape of the crucible 11 determined is not within the shape of FIG. 7(a) or FIG. 7(b), the shape inspection test is not passed. By this method, crucibles having shapes that are out of the tolerance zone can be prevented from being shipped.

<4. Three-Dimensional Distribution of Various Physical Properties>

The internal robot arm 5 and the external robot arm 7 can be equipped with a probe for measuring various physical properties. By moving the probe along the three-dimensional shape of the inner surface or the three-dimensional shape of the outer surface of the crucible 11, three-dimensional distribution of various physical properties can be determined. The internal robot arm 5 and the external robot arm 7 may be equipped with a plurality of kinds of probes to measure a plurality of physical properties simultaneously, or the probe may be appropriately changed to measure the plurality of physical properties. In addition, the probes may be changed manually or may be changed automatically using an auto-changer.

Further, the afore-mentioned internal ranging section 17, the external ranging section 19, and the various probes described later are connected with an external processor having a database function, and can be structured so that the measurement data is taken into the database immediately after the measurement. Here, at the external processor, judgment on PASSED/NOT PASSED can be made for the various shapes and the physical properties, and thus quality inspection of the crucible can be conducted easily.

<5. Measurement Conducted while Holding with Robot Arm>

Figure 8:
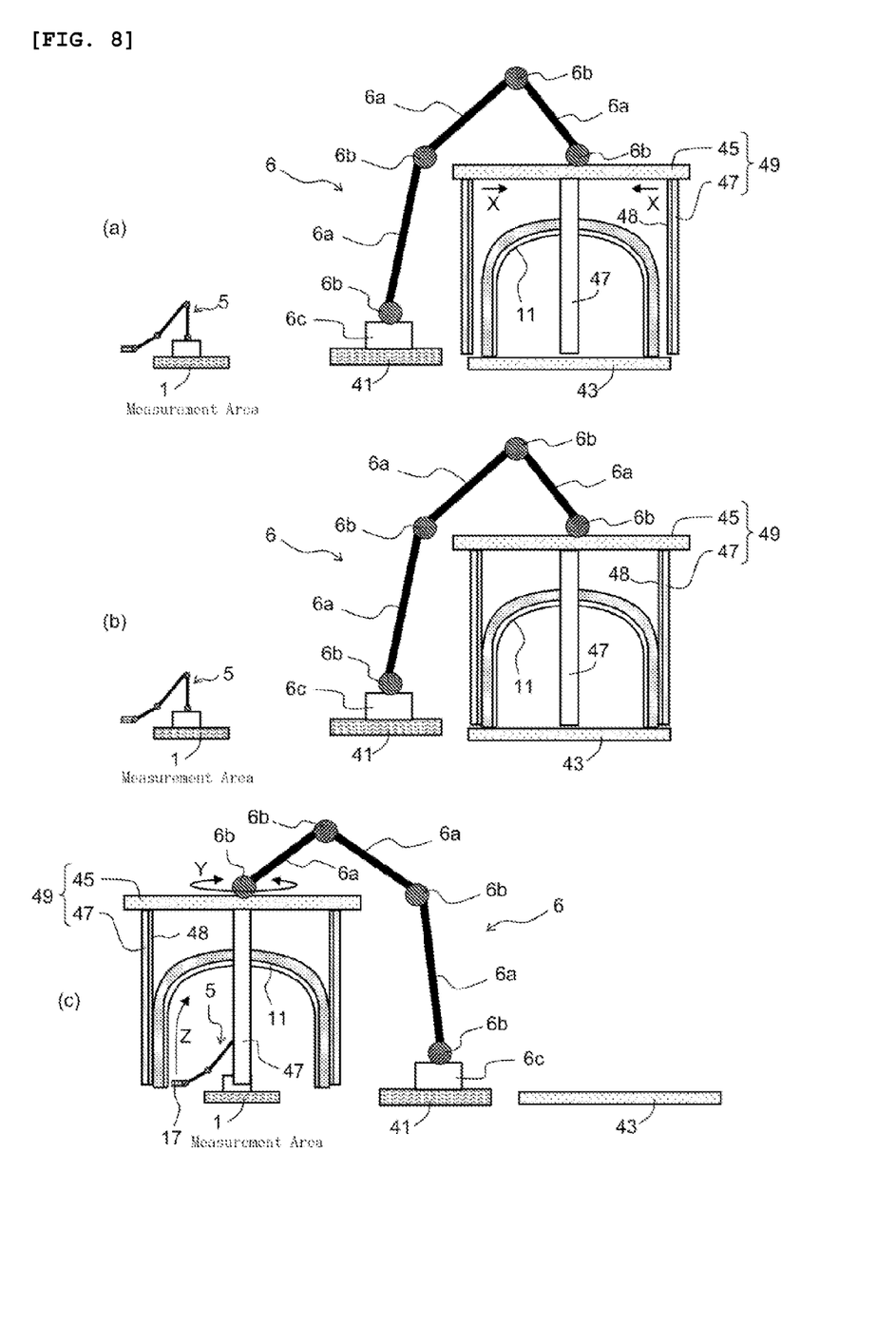
FIGS. 8(a), 8(b) and 8(c) are explanatory drawings for a method to carry out the measurement while the crucible is held by the robot arm for conveyance.

In the afore-mentioned embodiments explained with reference to FIGS. 3(a) and 3(b), measurement was conducted by mounting the crucible 11 on the rotating table 9. Here, in another embodiment, as shown in FIGS. 8(a)-8(c), measurement may be conducted while the crucible 11 is hold by a robot arm for conveyance 6. Detailed description will be given hereinafter.

As shown in FIG. 8(a), the crucible as a measuring object is mounted on a mounting table 43 with its opening portion facing downwards. Near the mounting table 43, a robot arm for conveyance 6 is placed on a setting table 41. The robot arm for conveyance 6 is preferably a six-axis articulated robot, comprising a plurality of arms 6a, a plurality of joints 6b rotatably supporting the arm 6a, and a main body section 6c. An external terminal (not shown) is provided to the main body section 6c, to enable the main body section 6c to exchange data with an external device. The tip of the robot arm for conveyance 6 is provided with a holding section 49 to hold the crucible 11. The holding section 49 comprises a base 45 and at least four arms 47 extending from the base 45. In FIG. 8(a), the four arms are arranged with an interval of 90 degrees in the circumferential direction. The arms 47 can be moved toward the center in the direction of the radius of the crucible 11, that is, in the direction shown with the arrow X in FIG. 8(a). The arms 47 are pressed against the sides of the crucible 11 with the holding section 49 in a state where the crucible 11 is positioned within the four arms 47. The outer side of the crucible 11 is the bubble containing layer 15, and its surface is rough. An elastic member 48 such as urethane rubber is provided on the surface of the arms 47 at the side of the crucible 11. Accordingly, the holding section 49 holds the crucible 11 steadily by the friction between the elastic member 48 and the side surface of the crucible 11. Here, in order not to destroy the crucible by applying too large pressure to the crucible 11 with the arm 47, the pressure being applied to the crucible from the arms 47 is controlled within an appropriate value by using a pressure sensor and the like.

FIG. 8(b) shows a state in which the holding section 49 is holding the crucible 11. From this state, the robot arm for conveyance 6 picks up the crucible 11, and then conveys the crucible 11 to the measuring area placed with the internal robot arm 5. Here, although not shown, the external robot arm 7 may be placed in the measuring area.

Then, as shown in FIG. 8(c), the robot arm for conveyance 6 holds the crucible within the measuring area, and, in such state, the internal robot arm 5 moves the internal ranging section 17 and the various probes along the inner surface of the crucible 11 to carry out the measurement.

Measurement for a particular position of the crucible with respect to the circumferential direction of the crucible 11 is carried out by moving the internal ranging section 17 between the bottom portion 11c and the opening portion of the crucible 11. Subsequently, the robot arm for conveyance 6 rotates the crucible 11 in the circumferential direction (the direction of the arrow Y shown in FIG. 8(c)). Then, the measurement is carried out again by moving the internal ranging section 17 between the bottom portion 11c and the opening portion of the crucible 11. Accordingly, the measurement can be carried out for the entire inner circumference surface by repeating the rotation of the crucible 11 and the measurement.

The rotation angle of the rotation after each of the measurement is, 2-10 degrees for example, preferably 6.3 degrees or less. When the rotation angle is 6.3 degrees or less, the difference in the sum length of the sides of the polygonal structured by connecting each of the measuring points in the circumferential direction with respect to the circumferential length of the perfect circle is 1% or less, and thus sufficient precision can be achieved.

The afore-described measurement of the three-dimensional shape conducted by fogging the crucible may be carried out at a different place before mounting the crucible 11 on the mounting table 43, carried out on the mounting table 43, carried out in the measuring area, or may be carried out in a different measuring area provided in the moving area of the robot arm for conveyance 6.

Example

Measurement of three-dimensional shape of the vitreous silica crucible was studied by using a three-dimensional shape measuring device which measures the three-dimensional shape by measuring the reflected light from a measuring object irradiated with a pattern light. When the measurement was carried out in a condition where the crucible was fogless, the shape of the crucible was not detected. On the other hand, when the measurement was carried out in a condition where the surface of the crucible was fogged by allowing the cooled crucible to stand in atmosphere, the shape of the inner surface of the crucible was measured.

The invention claimed is:

1. A method for measuring a three-dimensional shape of a vitreous silica crucible having a cylindrical sidewall portion having an opening with a rim portion, a mortar-shaped bottom portion, and a corner portion connecting the sidewall portion and the bottom portion, said corner portion having a curvature larger than a curvature of the bottom portion, wherein the crucible comprises a transparent vitreous silica layer at an inner surface side, and a bubble containing layer at an outer surface side, said method comprising the steps of:
    forming a fog onto an inner surface of all portions of the vitreous silica crucible constituted by the sidewall portion, the corner portion, and the mortar-shaped bottom portion,
    moving an internal ranging section along the inner surface of all the portions of the vitreous silica crucible in a contactless manner;
    measuring a distance between the internal ranging section and the inner surface of the transparent vitreous silica layer as a distance from the inner surface, by subjecting the inner surface of the crucible to irradiation with single laser light and then detecting a reflected light from the inner surface, the laser light being emitted from the internal ranging section in an oblique direction with respect to the inner surface, and the measurement being conducted at a plurality of measuring points along a course of a movement of the internal ranging section, wherein the plurality of measuring points include points at the sidewall portion, the corner portion, and the bottom portion;
    obtaining a three-dimensional shape of the inner surface of the crucible, by associating three-dimensional coordinates of each of the measuring points with the distance from the inner surface;
    measuring a distance between the internal ranging section and an interface between the transparent vitreous silica layer and the bubble containing layer, as a distance from the interface by using the single laser light and detecting light reflected by the interface with the internal ranging section;
    obtaining a three-dimensional shape of the interface by associating three-dimensional coordinates of each of the measuring points with the distance from the interface;
        wherein the single laser light emitted from the internal ranging section is partially reflected at the inner surface of the transparent vitreous silica layer and partially reflected at the interface so that two peaks corresponding to the reflected lights from the inner surface and the interface are observed when the reflected lights are measured by a laser displacement gauge provided in the internal ranging section, wherein the internal ranging section is moved closer to or away from the inner surface and/or the internal ranging section is tilted to alter the outgoing direction of the laser light so as to search a position and an angle which allows the observation of the two peaks;
    moving an external ranging section along an outer surface of all the portions of the vitreous silica crucible in a contactless manner;
    measuring a distance between the external ranging section and the outer surface as a distance from the outer surface, by subjecting the outer surface of the crucible to irradiation with laser light and then detecting a reflected light from the outer surface, the laser light being emitted from the external ranging section in an oblique direction with respect to the outer surface, and the measurement being conducted at a plurality of measuring points along a course of a movement of the external ranging section, wherein the plurality of measuring points include points at the sidewall portion, the corner portion, and the bottom portion;
    obtaining a three-dimensional shape of the outer surface of the crucible, by associating three-dimensional coordinates of each of the measuring points with the distance from the outer surface; and
    evaluating the crucible based on whether the obtained three-dimensional shape of the inner surface and the obtained three-dimensional shape of the outer surface is a shape within a range defined as being between a shape of a crucible having minimum thickness satisfying a predetermined dimension tolerance and a shape of a crucible having maximum thickness satisfying the predetermined dimension tolerance.

2. The method of claim 1, wherein the fog is formed by cooling the vitreous silica crucible.

3. The method of claim 1, wherein the fog is formed by increasing an amount of water vapor contained in an atmosphere around the vitreous silica crucible.

4. The method of claim 1, wherein an angle of incidence of the laser light emitted from the internal ranging section is 30 to 60 degrees with respect to the inner surface.

5. The method of claim 1, further comprising a step of: outputting coordinate data of the inner surface three-dimensional shape and the interface three-dimensional shape.

6. The method of claim 1, wherein
    the measurement of the inner surface three-dimensional shape is conducted by holding the crucible with a robot arm for conveyance, the robot arm for conveyance conveying the crucible to a measuring area, and
    the entire inner surface of the crucible is measured by repeating the steps of conducting a measurement for a particular position of the crucible with respect to a circumferential direction of the crucible by moving a tip of the internal robot arm between a bottom portion and an opening portion of the crucible and rotating the crucible by the robot arm for conveyance in the circumferential direction of the crucible.

7. The method of claim 6, wherein the crucible is rotated by the robot arm for conveyance by 6.3 degrees or less.

8. The method of claim 6, wherein
    the robot arm for conveyance holds the crucible by a holding section, and
    the holding section holds the crucible by pressing arms against a side surface of the crucible from at least four directions, each of the arms being provided with an elastic member at a surface contacting the crucible.

9. A method for manufacturing a monocrystalline silicon, comprising a monocrystalline silicon pulling step to pull a monocrystalline silicon from a silicone melt contained in a vitreous silica crucible,
wherein conditions for pulling the monocrystalline silicon is determined in accordance with a three-dimensional shape of the vitreous silica crucible, the three-dimensional shape being determined by the method of claim 1.

* * * * *